United States Patent
Sakata

(10) Patent No.: US 8,621,407 B2
(45) Date of Patent: Dec. 31, 2013

(54) APPARATUS AND METHOD FOR SUPPORTING CIRCUIT DESIGN, AND SEMICONDUCTOR INTEGRATED CIRCUIT

(75) Inventor: Tsuyoshi Sakata, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/236,231

(22) Filed: Sep. 19, 2011

(65) Prior Publication Data
US 2012/0139602 A1 Jun. 7, 2012

(30) Foreign Application Priority Data
Dec. 7, 2010 (JP) .................................. 2010-272553

(51) Int. Cl.
*G06F 17/50* (2006.01)
(52) U.S. Cl.
USPC .......................................... 716/113; 716/126
(58) Field of Classification Search
USPC .................................................. 716/113, 126
See application file for complete search history.

(56) References Cited

U.S. PATENT DOCUMENTS 7,921,393 B2 * 4/2011 Furnish et al. ................ 716/110

FOREIGN PATENT DOCUMENTS

| JP | 2008-21134 | 1/2008 |
| JP | 2009-110380 | 5/2009 |

* cited by examiner

*Primary Examiner* — Thuan Do
(74) *Attorney, Agent, or Firm* — Fujitsu Patent Center

(57) ABSTRACT

In a circuit design support apparatus, a selection unit selects a delay circuit model from among two or more delay circuit models with wire load based on different values of physical parameters relating to wiring, on the basis of a difference value in a physical parameter between a first path and a second path, the first path being from a branch point of a clock signal line for supplying a clock signal to a register model of a semiconductor integrated circuit model to be designed up to a clock signal input terminal of the register model, the second path being from the branch point up to a data signal input terminal of the register model. An arrangement unit arranges the selected delay circuit model on a data signal line connected to the data signal input terminal.

11 Claims, 12 Drawing Sheets

T1 COMPONENT MANAGEMENT TABLE

| DELAY CIRCUIT MODEL NAME | WIRING LENGTH (μm) | WIRING RESISTANCE (Ω) | WIRING CAPACITANCE (fF) | WIRING DELAY (ns) | DELAY TIME (ns) |
|---|---|---|---|---|---|
| A | 10 | 10 | 1 | 0 | 1 |
| B | 100 | 100 | 10 | 1 | 1 |
| C | 200 | 200 | 20 | 2 | 1 |
| D | 10 | 10 | 1 | 0 | 2 |
| E | 100 | 100 | 10 | 1 | 2 |

APPARATUS AND METHOD FOR SUPPORTING CIRCUIT DESIGN, AND SEMICONDUCTOR INTEGRATED CIRCUIT

CROSS-REFERENCE TO RELATED APPLICATION

This application is based upon and claims the benefit of priority of the prior Japanese Patent Application No. 2010-272553, filed on Dec. 7, 2010 the entire contents of which are incorporated herein by reference.

FIELD

The embodiments discussed herein are related to an apparatus and method for supporting circuit design, and a semiconductor integrated circuit.

BACKGROUND

In recent years, along with miniaturization and high integration of semiconductor integrated circuits, fluctuations of delay time due to variations (hereinafter, referred to as process variation) in gate length and gate width, or variations (hereinafter, referred to as wiring variation) in wiring length and wiring width in transistors of semiconductor integrated circuits increase. To cope with the above, a technology in which a burden of a timing verification to verify the above-described variations of the delay time is suppressed from increasing is considered.

In the timing verification, for example, whether timing between a data signal supplied to a register (flip-flop) and a clock signal satisfies a timing restriction is verified. When the timing fails to satisfy the timing restriction, for example, a delay buffer with a large delay is inserted into a data path to transfer a data signal or a clock path to transfer a clock signal to thereby adjust the delay time.
Japanese Laid-open Patent publications No. 2009-110380
Japanese Laid-open Patent publications No. 2008-21134

However, a wiring within the delay buffer is short, and a difference between a path into which the delay buffer is inserted and other paths may be caused in fluctuations in the delay time due to the wiring variation. Therefore, depending on relationships between the process variation and the wiring variation in transistors, a timing margin (slack) allowable between a data signal and a clock signal, which are supplied to a register, largely fluctuates, and as a result, a timing violation occurs.

SUMMARY

According to one aspect of the present invention, this circuit design support apparatus includes a selection unit to select a delay circuit model from among two or more delay circuit models with wire load based on different values of physical parameters relating to wiring, on the basis of a difference value in a physical parameter between a first path and a second path, the first path being from a reference position of a clock signal line for supplying a clock signal to a register model of a semiconductor integrated circuit model to be designed up to a clock signal input terminal of the register model, the second path being from the reference position up to a data signal input terminal of the register model; and an arrangement unit to arrange the selected delay circuit model on a data signal line connected to the data signal input terminal.

The object and advantages of the invention will be realized and attained by means of the devices and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be described in detail below with reference to the accompanying drawings.

First, a circuit design support apparatus according to the embodiment will be described, and then the embodiments will be described in more detail.

First Embodiment

Figure 1:
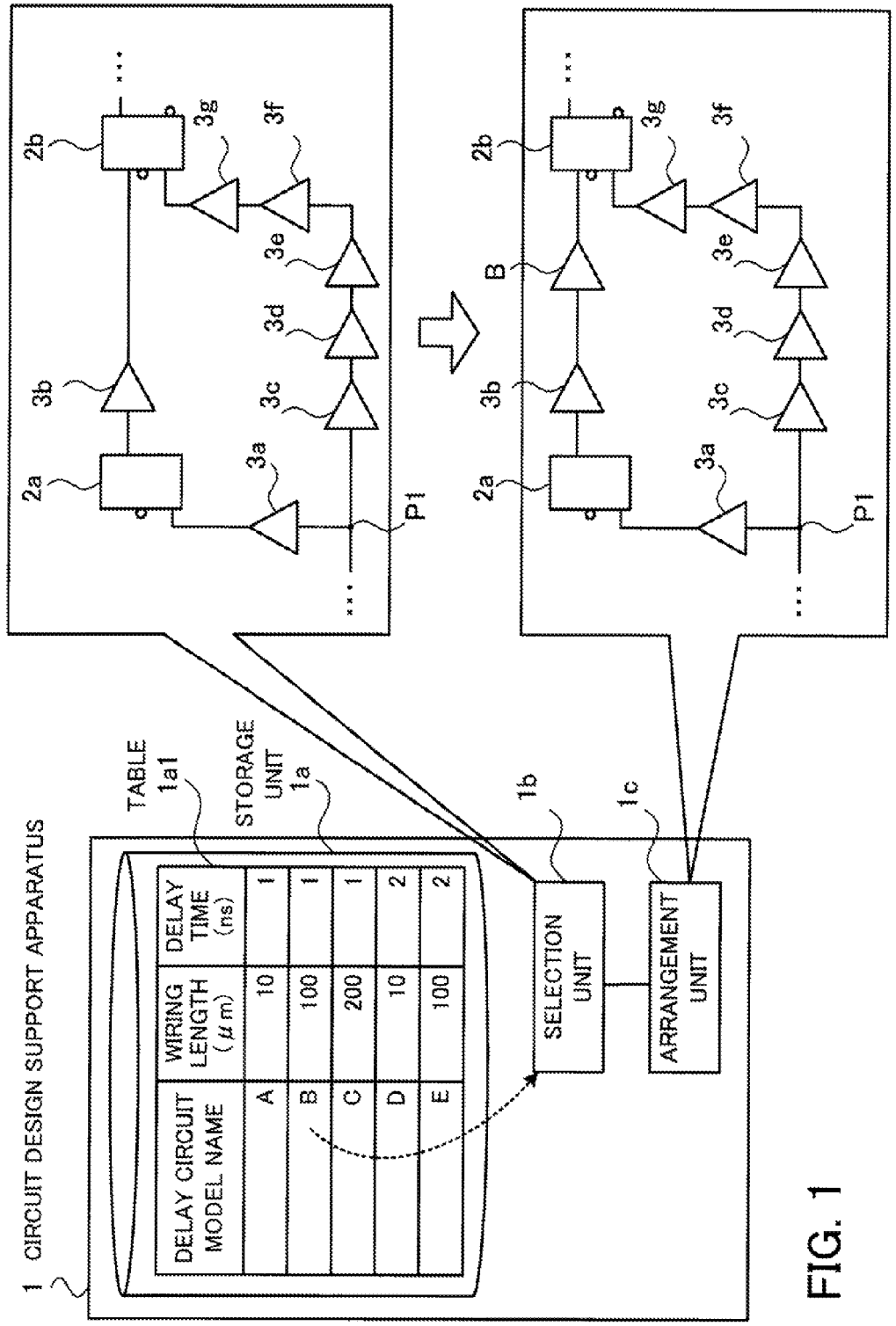
FIG. 1 illustrates an outline of a circuit design support apparatus according to a first embodiment.

FIG. 1 illustrates an outline of the circuit design support apparatus according to a first embodiment.

The circuit design support apparatus (computer) 1 according to the present embodiment has a function of arranging a delay circuit model that avoids a timing violation at a place in which the timing violation occurs during timing verification, in a model (semiconductor integrated circuit model) of a semiconductor integrated circuit to be designed. The circuit design support apparatus 1 according to the present embodiment includes, for example, a storage unit 1a, a selection unit 1b, and an arrangement unit 1c.

The storage unit 1a stores information to identify two or more delay circuit models with wire load based on different values of physical parameters relating to wiring. Examples of the physical parameters include a delay time of signals due to a wiring length, a wiring resistance, a wiring capacitance, and a wire load. In FIG. 1, a table 1a1 stored in the storage unit 1a is illustrated. In the table 1a1, a case where the wiring length as a physical parameter relating to the wiring is used is illustrated as one example. In a column of the wiring length of the table 1a1, the wiring length of the wire load is stored. Also, in the column of the delay time, a value of the delay time generated by the delay circuit model is stored.

The selection unit 1b acquires a difference value in the physical parameter (the wiring length according to the present embodiment) between the wiring of a first path and that of a second path, both being from a reference position of a clock signal line for supplying a clock signal up to a register model in which the timing violation occurs.

The first path is a path from the reference position up to a data signal input terminal of the register model, and hereinafter, is referred to as a data path. The second path is a path from the reference position up to a clock signal input terminal of the register model, and hereinafter, is referred to as a clock path.

The selection unit 1b may find the difference value by an arithmetical operation, or acquire it from other devices (not illustrated).

FIG. 1 illustrates a register model 2a and a post-stage register model 2b. Into the clock signal line and data signal line, two or more buffer models that suppress skew of signals are inserted.

In the data path of FIG. 1, a branch point P1 of the clock signal line is set as the reference position. The data path is a path from this branch point P1 in the transmission direction of signals, namely, up to the data signal input terminal of the register model 2b via a buffer model 3a, the register model 2a, and a buffer model 3b. On the other hand, the clock path of FIG. 1 is a path from the branch point P1 in the transmission direction of signals, namely, up to the clock signal input terminal of the register model 2b via buffer models 3c, 3d, 3e, 3f, and 3g.

Further, the selection unit 1b selects a delay circuit model from the two or more delay circuit models based on the wiring length and delay time of the acquired data path and clock path. For example, the selection unit 1b selects from the table 1a1 the delay circuit model having a wiring length equal to a difference in wiring length between the data path and the clock path, and having a delay time to satisfy the timing restriction. For example, where a difference in wiring length between the data path and the clock path is 100 μm and a time of 1 ns is needed to satisfy the timing restriction, the selection unit 1b refers to the table 1a1, and selects the delay circuit model B matched with the conditions.

The arrangement unit 1c arranges the selected delay circuit model on the data signal line between the register models. In FIG. 1, the arrangement unit 1c arranges the delay circuit model B on the data signal line between the register model 2a and the register model 2b. Note that the delay circuit model B may be memorized in the memory unit (not illustrated) within the circuit design support apparatus 1, or read out from another apparatus (not illustrated) and arranged.

According to this circuit design support apparatus 1, the selection unit 1b refers to the table 1a1 to select the delay circuit model to be arranged, and the arrangement unit 1c arranges the delay circuit model selected by the selection unit 1b. The delay circuit model to be arranged compensates for a difference in physical parameters relating to wiring between the data path and the clock path. Therefore, wiring variation of the data path matches that of the clock path. As a result, since the fluctuation of the delay time due to the wiring variation in the data patch matches that in the clock path, the timing violation due to the wiring variation is suppressed from occurring.

Further, the selection circuit model is selected according to the delay time between the data path and the clock path. Therefore, a semiconductor integrated circuit model is designed with both the process variation and the wiring variation of transistors taken into consideration. Further, the timing violation in the semiconductor integrated circuit may be suppressed from occurring.

In addition, the selection unit 1b and the arrangement unit 1c are realized by a function of the central processing unit (CPU) of the circuit design support apparatus 1. Further, the storage unit 1a is realized by a data storage area of a random access memory (RAM) or hard disk drive (HDD) of the circuit design support apparatus 1.

Preferred embodiment will be described in more detail below.

Second Embodiment

Figure 2:
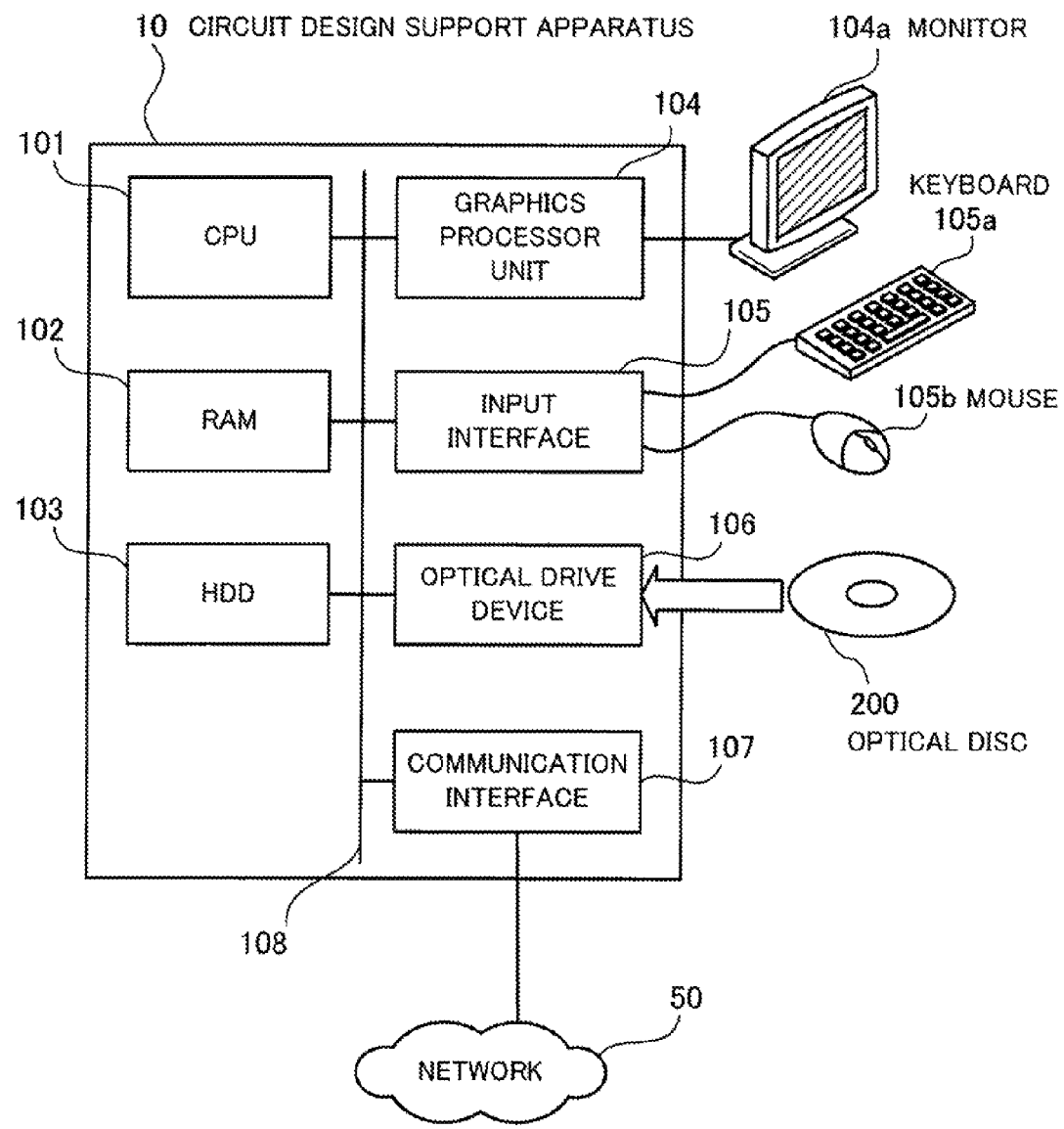
FIG. 2 illustrates one configuration example of hardware of the circuit design support apparatus according to a second embodiment.

FIG. 2 illustrates one configuration example of hardware of the circuit design support apparatus according to a second embodiment.

The entire circuit design support apparatus 10 is controlled by a CPU 101. To the CPU 101, a RAM 102 and two or more peripherals are connected via a bus 108.

The RAM 102 is used as a main storage for the circuit design support apparatus 10. The RAM 102 temporarily stores at least part of an operating system (OS) program and application programs, which are run by the CPU 101. Further, the RAM 102 stores various data used for processing executed by the CPU 101.

As the peripherals connected to the bus 108, an HDD 103, a graphics processor unit 104, an input interface 105, an optical drive device 106, and a communication interface 107 are used.

The HDD 103 magnetically writes and reads the data to/from an internal disk. The HDD 103 is used as a secondary storage device for the circuit design support apparatus 10. The HDD 103 stores the OS program, application programs, and various data. A semiconductor memory device such as a flash memory may also be used as the secondary storage device.

To the graphics processor unit 104, a monitor 104a is connected. In accordance with an instruction from the CPU 101, the graphics processor unit 104 displays an image on the screen of the monitor 104a. The monitor 104a includes a liquid crystal display device using a cathode ray tube (CRT).

To the input interface 105, a keyboard 105a and a mouse 105b are connected. The input interface 105 supplies signals, which are produced from the keyboard 105a and the mouse 105b, to the CPU 101. The mouse 105b is one example of pointing devices, and other pointing devices may also be used. The other pointing devices include a touch panel, a tablet, a touch pad, and a track ball.

An optical drive device 106 reads data recorded on an optical disc 200 by using laser light. The optical disc 200 is a portable recording medium on which data is recorded so as to be read by reflection of light. The optical disc 200 includes a Blu-ray, a digital versatile disc (DVD), a DVD-RAM, a compact disc read only memory (CD-ROM), and a CD-recordable/rewritable (CD-R/RW).

The communication interface 107 is connected to a network 50. The communication interface 107 transmits and receives data to and from other computers or communication devices via the network 50.

By the above-described hardware configuration, processing functions according to the present embodiment are realized.

Within the circuit design support apparatus 10 having the hardware configuration, the following functions are provided.

Figure 3:
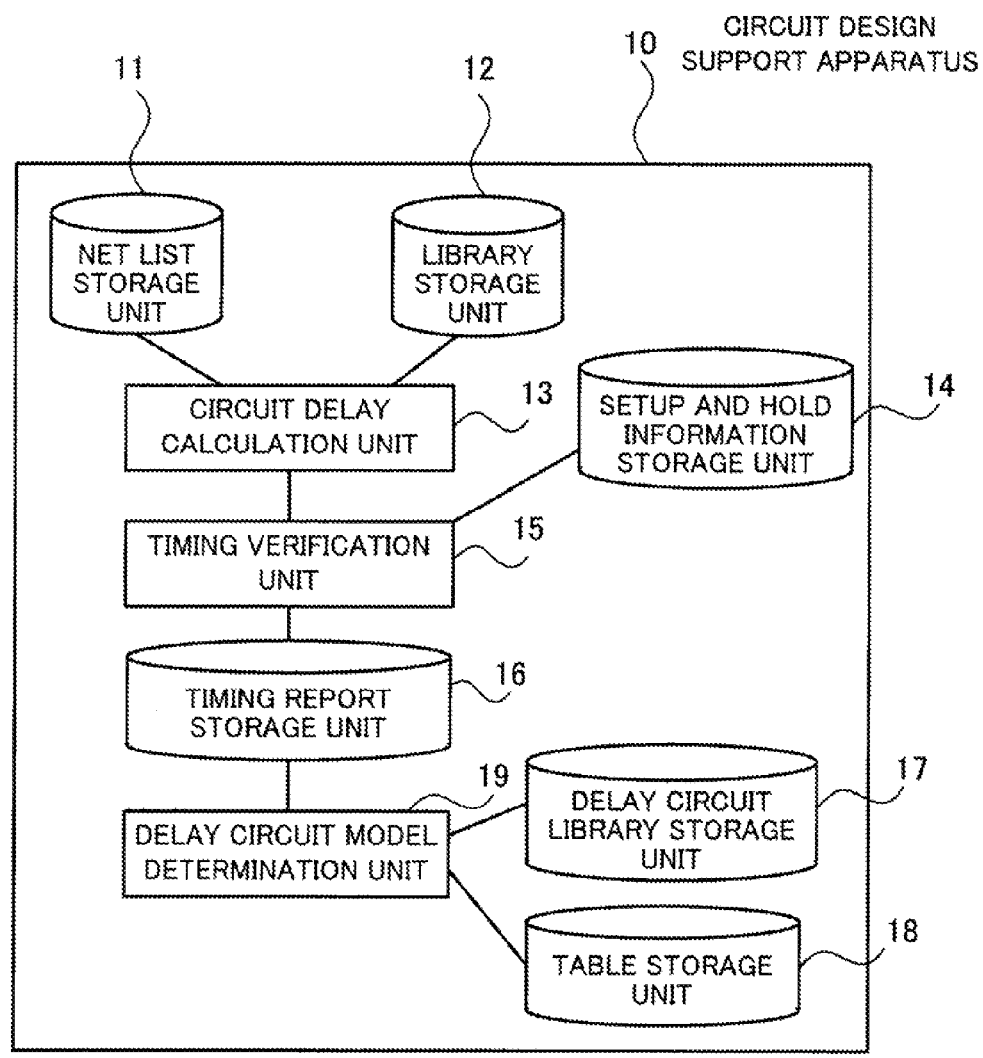
FIG. 3 is a block diagram illustrating a function of the circuit design support apparatus.

FIG. 3 is a block diagram illustrating a function of the circuit design support apparatus. The circuit design support apparatus 10 includes a net list storage unit 11, a library storage unit 12, a circuit delay calculation unit 13, a setup and hold information storage unit 14, a timing verification unit 15, a timing report storage unit 16, a delay circuit library storage unit 17, a table storage unit 18, and a delay circuit model determination unit 19.

In the net list storage unit 11, a net list representing a logical connection between circuits of a semiconductor integrated circuit model to be designed is stored.

In the library storage unit 12, libraries of CAD data on circuits and units are stored.

The circuit delay calculation unit 13 calculates a delay of the semiconductor integrated circuit model based on the net list stored in the net list storage unit 11 and the libraries stored in the library storage unit 12.

In the setup and hold information storage unit 14, information on a setup time and hold time of a resister of the semiconductor integrated circuit model is stored.

The timing verification unit 15 performs static timing analysis (STA). Specifically, based on the setup time and the hold time, the timing verification unit 15 determines whether a delay time calculated by the circuit delay calculation unit 13 causes the timing violation from a relative relationship between clock signals and data signals. The timing verification unit 15 then stores verification results in the timing report storage unit 16.

In the delay circuit library storage unit 17, two or more types of delay circuit models (buffer circuit models) with wire load based on different values of physical parameters relating to the wiring are stored.

In the table storage unit 18, a table to manage the physical parameters (e.g., the wiring length and the wiring resistance) relating to the wiring of the delay circuit model is stored.

Based on the timing report stored in the timing report storage unit 16, the delay circuit model determination unit 19 determines whether to arrange a delay circuit model on the data signal line connected to the data signal input terminal of a register model in which the timing violation occurs. If determining that a delay circuit model is to be arranged, the delay circuit model determination unit 19 determines a delay circuit model to be inserted into the semiconductor integrated circuit model from among the delay circuit models stored in the delay circuit library storage unit 17. This determination method will be described in detail later. In addition, the delay circuit model determination unit 19 arranges the determined delay circuit model on the data signal line connected to the data signal input terminal of the above-described register model.

Delay circuit models stored in the delay circuit library storage unit 17 will be described below.

A delay circuit model according to the present embodiment is a model in which two or more wiring models are combined with one previously-prepared type of transistor model. In addition, two or more types of transistor models may be prepared.

FIGS. 4A to 6 illustrate delay circuit models stored in the delay circuit library storage unit.

Figure 4A:
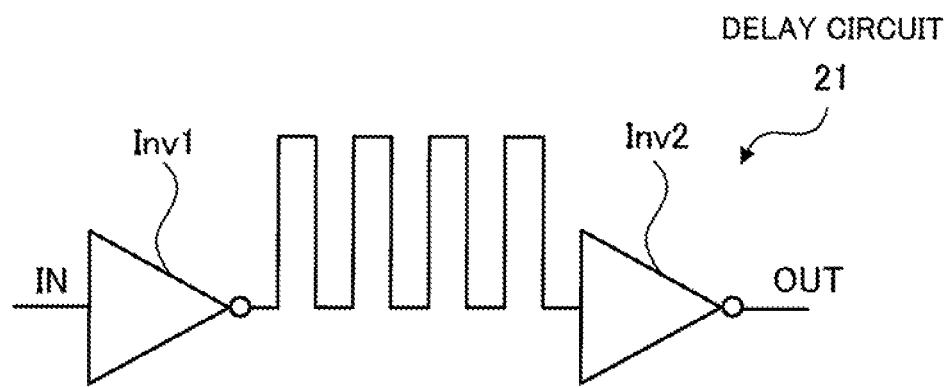
FIGS. 4A and 4B illustrate a delay circuit model stored in a delay circuit library storage unit.
Figure 4B:
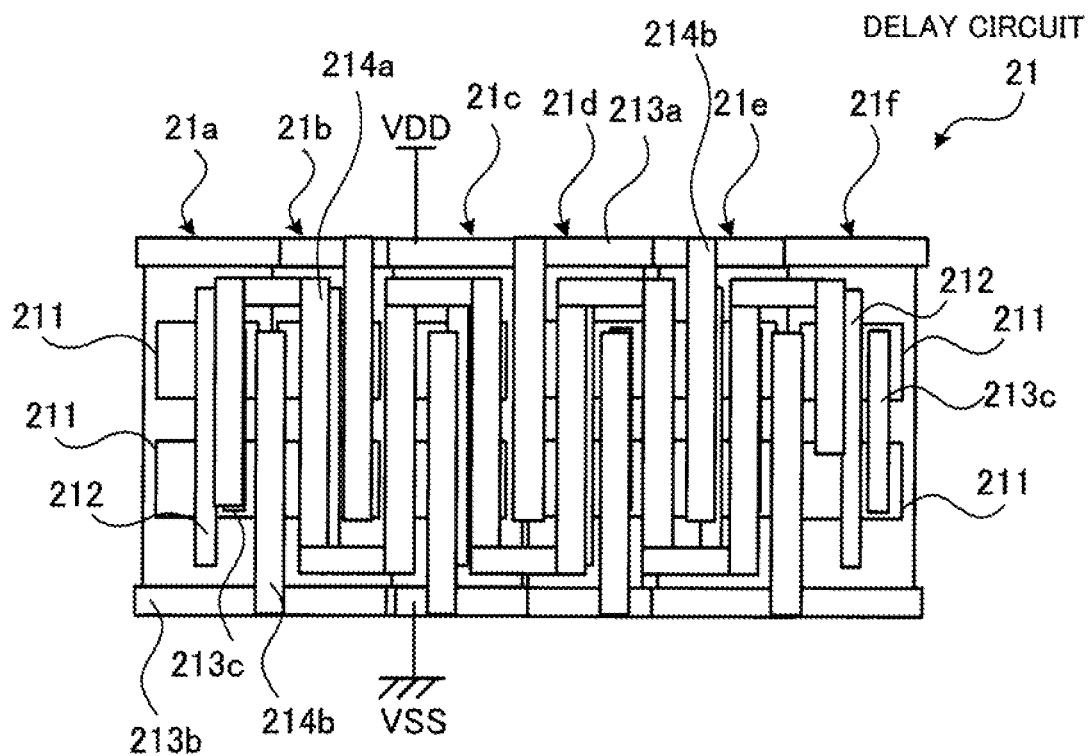

FIGS. 4A and 4B illustrate an internal structure of a delay circuit 21 as a delay circuit embodied by a delay circuit model.

FIG. 4A illustrates an equivalent circuit of the delay circuit 21. The delay circuit 21 has an inverter Inv1 connected to a signal input terminal IN and an inverter Inv2 connected to a signal output terminal OUT. Further, between the inverter Inv1 and the inverter Inv2, a wiring is formed in which a detour circuit is set such that a delay time of the wiring increases as compared with a case where the inverter Inv1 and the inverter Inv2 are wired in a shortest distance.

FIG. 4B illustrates the delay circuit 21 of FIG. 4A by using a layered structure. In the delay circuit 21, a diffusion layer, a polysilicon layer, a first metal layer, and a second metal layer are laminated in this order. In addition, other layers may be inserted between the above-described layers.

The delay circuit 21 has transistors 21a, 21b, 21c, 21d, 21e, and 21f each having equivalent structure.

For example, the transistor 21a has a diffusion region 211 formed in the diffusion layer and in which a source and a drain are configured, a polysilicon 212 formed in the polysilicon layer and in which a gate electrode is configured, and electrodes 213a, 213b, and 213c formed in the first metal layer. To the electrode 213a, a power supply voltage VDD is supplied, and a power supply voltage VSS is supplied to the electrode 213b. The electrode 213c connects respective diffusion regions 211 of the transistors.

Further, the signal input terminal IN is connected to the polysilicon 212 of the transistor 21a, and the signal output terminal OUT is connected to the electrode 213c of the transistor 21f.

Further, each of the diffusion region 211 of the transistor 21a and the polysilicon 212 of the transistor 21f is connected via a via (not illustrated) to the wiring 214a formed on the second metal layer. For example, when inserted into a semiconductor integrated circuit model, this wiring 214a is used as a data signal line. As a result, the delay circuit 21 is configured by two stages of inverter circuits. As described above, the delay circuit 21 illustrated in FIG. 4B represents an example in which the transistors 21b, 21c, 21d, and 21e are not used as a transistor that increases a delay time of a gate.

The wiring 214a has two or more bend sections. In addition, in the shape of the wiring, for example, a part of or the entire of wiring may be curved, or curved in a V shape or U shape irrespective of the illustrated shape. Between portions of the wiring 214a which are formed parallel to each other by bending, the electrode 214b that is formed on the second metal layer is inserted so as not to come into contact with the wiring 214a is inserted. In the electrode 214b, one part of the electrode 214b is connected to the power supply voltage VDD via the electrode 213a formed on the first metal layer. On the other hand, the other part of the electrode 214b is connected to the power supply voltage VSS via the electrode 213b formed on the first metal layer. When the electrode 214b is inserted between the portions of the wiring 214a parallel to each other, electric capacity of the delay circuit 21 may be increased.

Further, FIG. 4B illustrates a case where the wiring 214a is formed only on the second metal layer. Irrespective of the above, the wiring 214a may be formed to extend to another layer such as the first metal layer.

Figure 5:
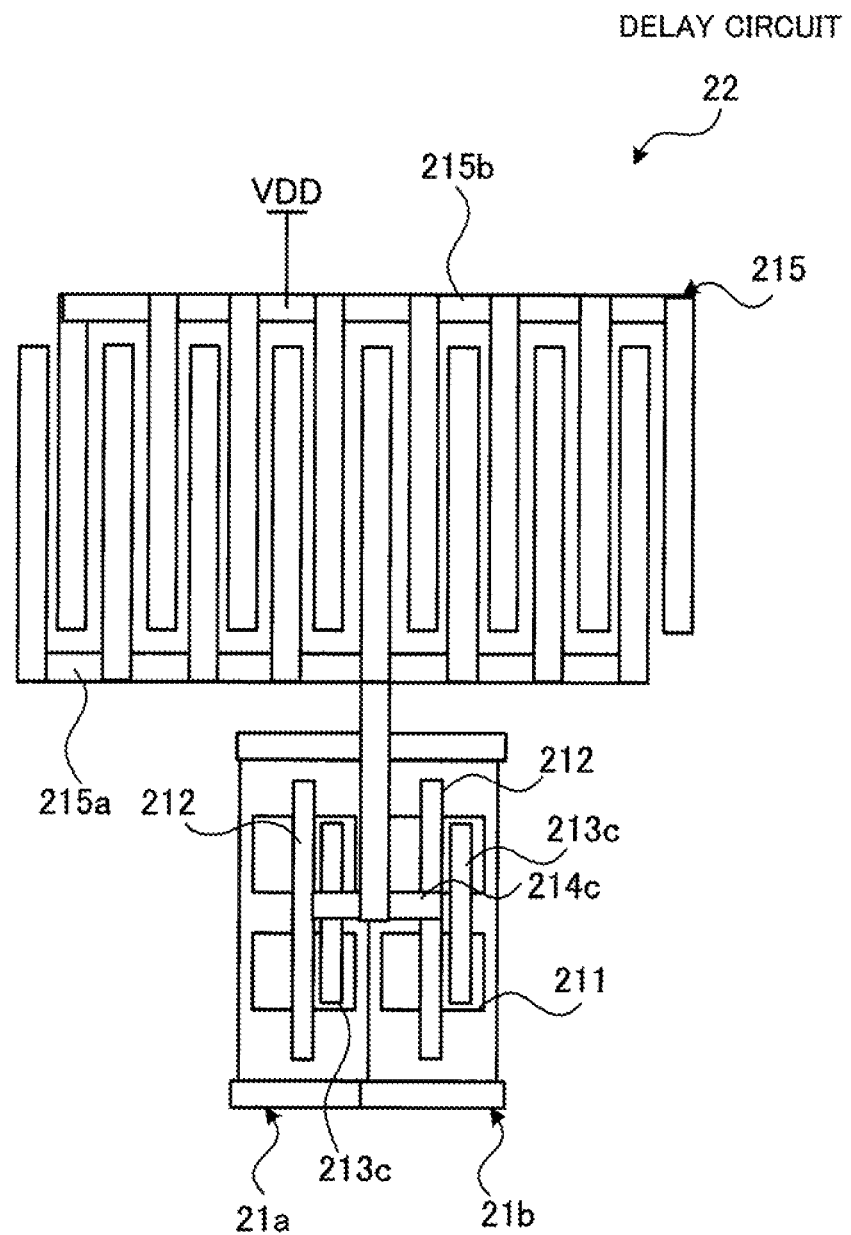
FIG. 5 illustrates the delay circuit model stored in the delay circuit library storage unit.

A delay circuit 22 illustrated in FIG. 5 has the transistors 21a and 21b. The signal input terminal IN is connected to the polysilicon 212 of the transistor 21a, and the signal output terminal OUT is connected to the electrode 213c of the transistor 21b. In the delay circuit 22, the electrode 213c of the transistor 21a and the polysilicon 212 of the transistor 21b are connected to each other via a wiring 214c. This wiring 214c is formed on the second metal layer, and connects the electrode 213c of the transistor 21a and the polysilicon 212 of the transistor 21b in a shortest distance. To this wiring 214c, a wiring 215 formed on the second metal layer is connected.

The wiring 215 has comb-shaped electrodes 215a and 215b formed to be interdigitated to each other. The electrode 215b is connected to the power supply voltage VDD. By the above-described configuration, a resistance value of the wiring to connect the transistors 21a and 21b is prevented from increasing and a capacity load may be increased.

Figure 6:
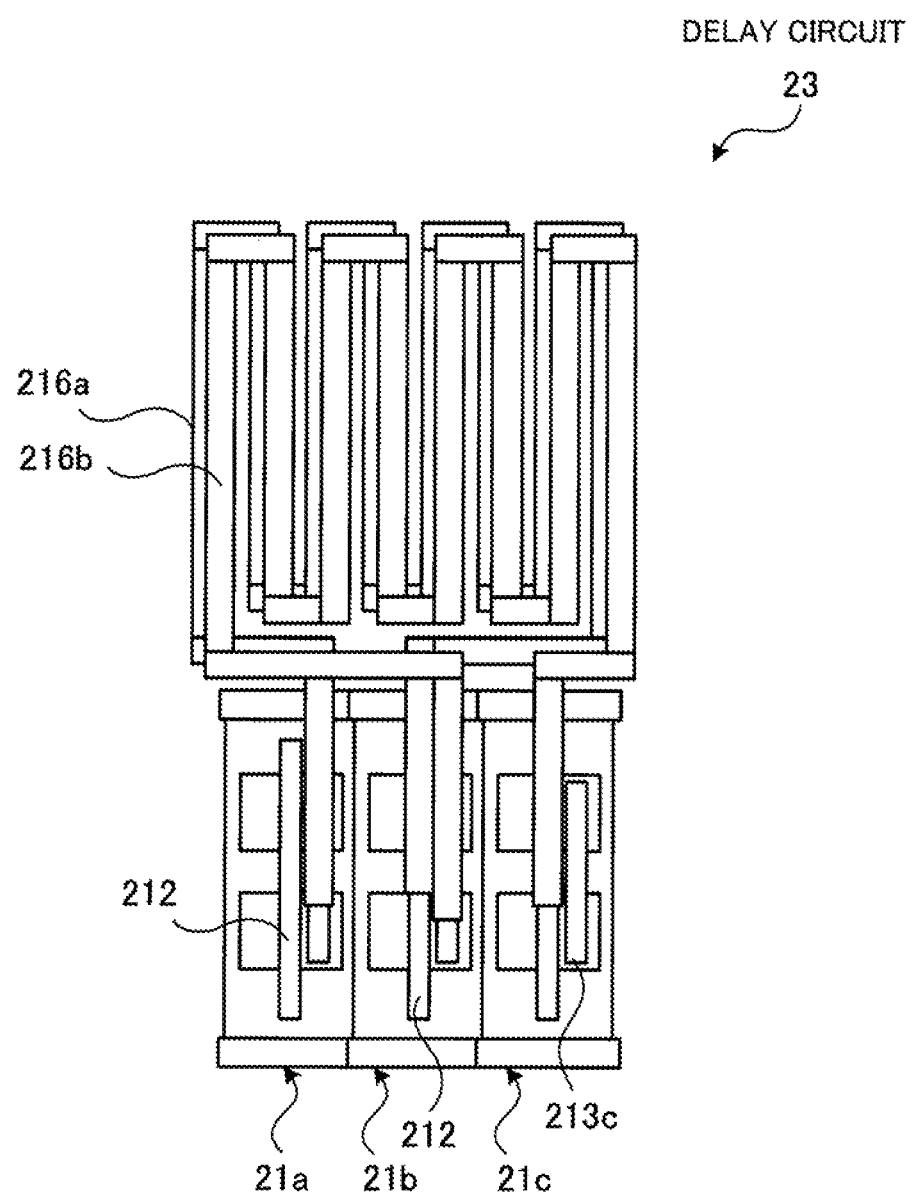
FIG. 6 illustrates the delay circuit model stored in the delay circuit library storage unit.

In a delay circuit 23 illustrated in FIG. 6, a diffusion layer, a polysilicon layer, a first metal layer, a second metal layer, and a third metal layer are laminated in this order. In addition, other layers may be inserted between these layers.

The delay circuit 23 has the transistors 21a, 21b, and 21c. In this delay circuit 23, the electrode 213c of the transistor 21a and the polysilicon 212 of the transistor 21b are connected to each other through the wiring 216a formed on the second metal layer. Further, the electrode 213c of the transistor 21b and the polysilicon 212 of the transistor 21c are alternately connected through the wiring 216b formed on the third metal layer. The wirings 216a and 216b each have two or more bend sections. Further, the wirings 216a and 216b are formed so that at least part thereof may overlap in a plan view. By the above-described configuration, a capacity load of the wiring may be increased.

With reference to FIGS. 4A to 6, the previously-combined delay circuits are described. Irrespective of the above, component models which form each delay circuit model may be prepared and stored in the delay circuit library storage unit 17.

Figure 7:
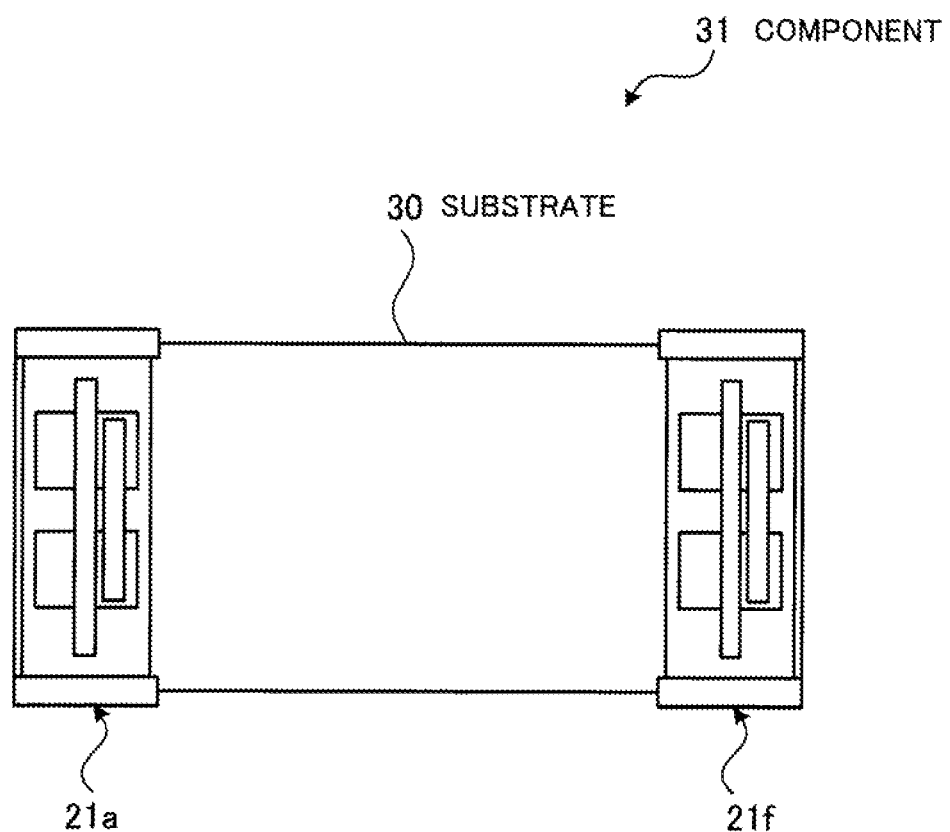
FIG. 7 illustrates a component model stored in the delay circuit library storage unit.

FIG. 7 illustrates a component model stored in the delay circuit library storage unit.

FIG. 7 illustrates an internal structure of A component 31a as a circuit embodied by component models.

In the component 31, the transistors 21a and 21f are arranged on the substrate 30. Between the transistors 21a and 21f on this substrate 30, the transistors 21b, 21c, 21d, and 21e, the wirings 214a, 214c, 215, 216a, and 216b, and the electrode 214b may be arranged. By the delay circuit model determination unit 19 selecting and arranging the transistors and the wirings, the delay time of the transistors and that of the wirings in the delay circuit may be set to an arbitrary time.

FIGS. 8A to 8D illustrate one example of components to be arranged between the transistors.

Figure 8A:
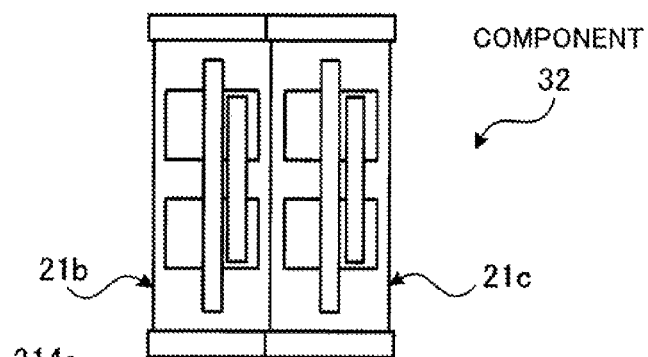
FIGS. 8A to 8D illustrate one example of components arranged between transistors.

In the component 32 illustrated in FIG. 8A, a gate capacitance of the transistors 21b and 21c is used as a load. For example, the component 32 is arranged between the transistors 21a and 21f, and an output of the transistor 21a is connected to the transistor 21f via the transistors 21b and 21c. By doing so, the gate capacitor of the transistors 21b and 21c is added as a load to a normal buffer in which the output from the transistor 21a is simply connected to the transistor 21f.

Figure 8B:
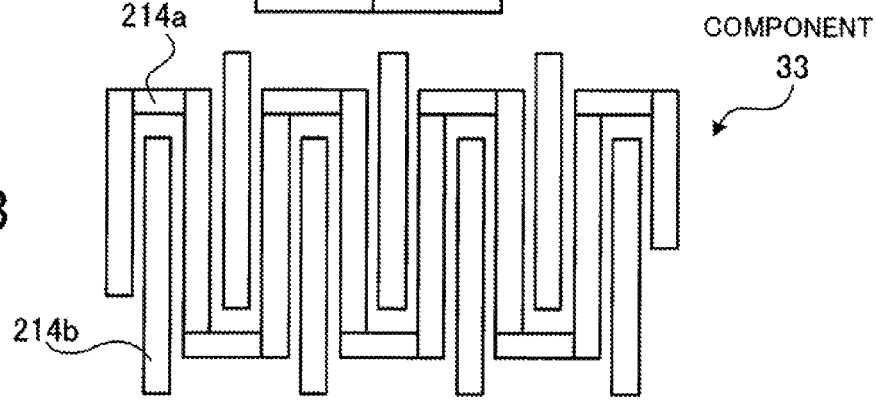

A component 33 illustrated in FIG. 8B is a component in which the wiring 214a and the electrode 214b are combined. By arranging this component 33 between the transistors 21a and 21f, the delay circuit 21 is prepared.

Figure 8C:
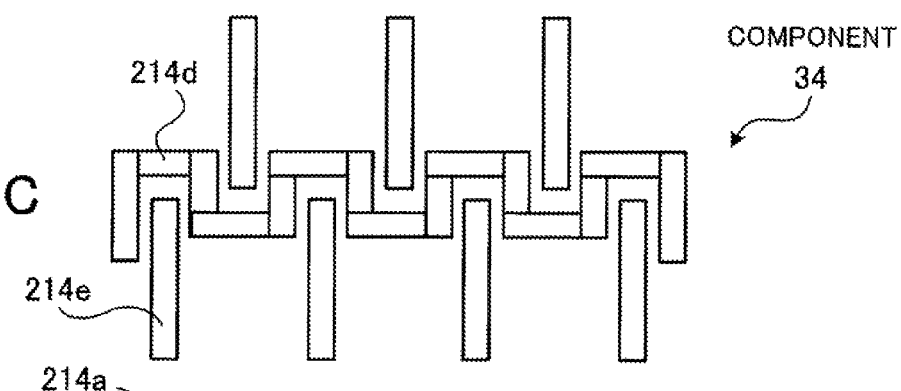

A component 34 illustrated in FIG. 8C has a wiring 214d having a wiring length shorter than that of the wiring 214a, and an electrode 214e formed corresponding to the wiring 214d. This component 34 is smaller than the component 33 in the wiring length, the wiring resistance, and the wiring capacitance. By arranging this component 34 between the transistors 21a and 21f, a delay circuit having the wiring length, wiring resistance, and wiring capacitance smaller than those of the delay circuit 21 is prepared.

Figure 8D:
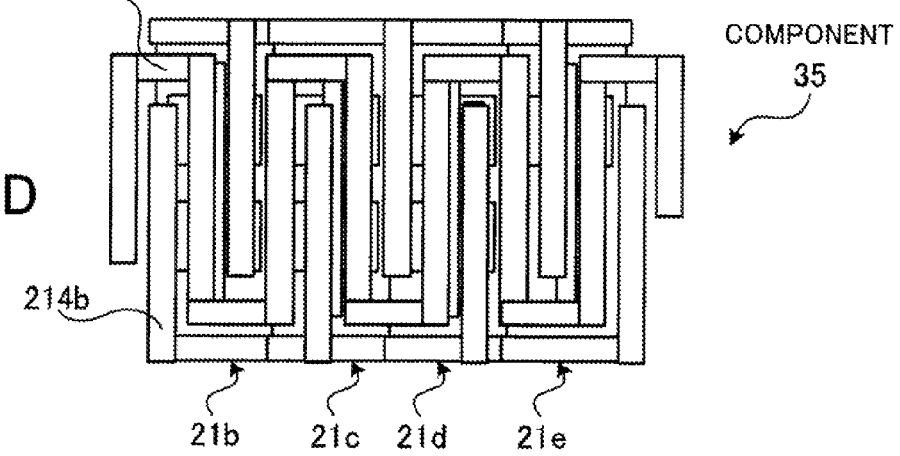

A component 35 illustrated in FIG. 8D is a component in which the transistors 21b, 21c, 21d, and 21e are previously combined with the wirings 214a and 214b. As described above, transistors and components may be previously combined and stored.

In FIGS. 4A to 8D, there are described examples in which the transistors 21a to 21f each having equivalent structure and the components are combined. However, irrespective of the above, two or more transistors with different delay times of a gate may be stored in the delay circuit library storage unit, and these transistors may be combined with the components.

Contents of the component management table will be described below.

Figure 9:
FIG. 9 illustrates a component management table.

FIG. 9 illustrates the component management table.

In the component management table T1, columns of the delay circuit model name, the wiring length (μm), the wiring resistance (Ω), the wiring capacitance (fF), the wiring delay (ns), and the delay time (ns) are provided. Information of the items arranged in the lateral direction is associated with each other.

In the column of the delay circuit model name, a name to identify a delay circuit model is set. In the column of the wiring length, the wiring length of each delay circuit model is set. In the column of the wiring resistance, a resistance value of the wiring of each delay circuit model is set. In the column of the wiring capacitance, a capacitance value of the wiring of each delay circuit model is set. In the column of the wiring delay, a delay time due to the wiring of each delay circuit model is set. In the column of the delay time, the delay time of each delay circuit model is set.

Processes of the circuit design support apparatus 10 will be described below.

Figure 10:
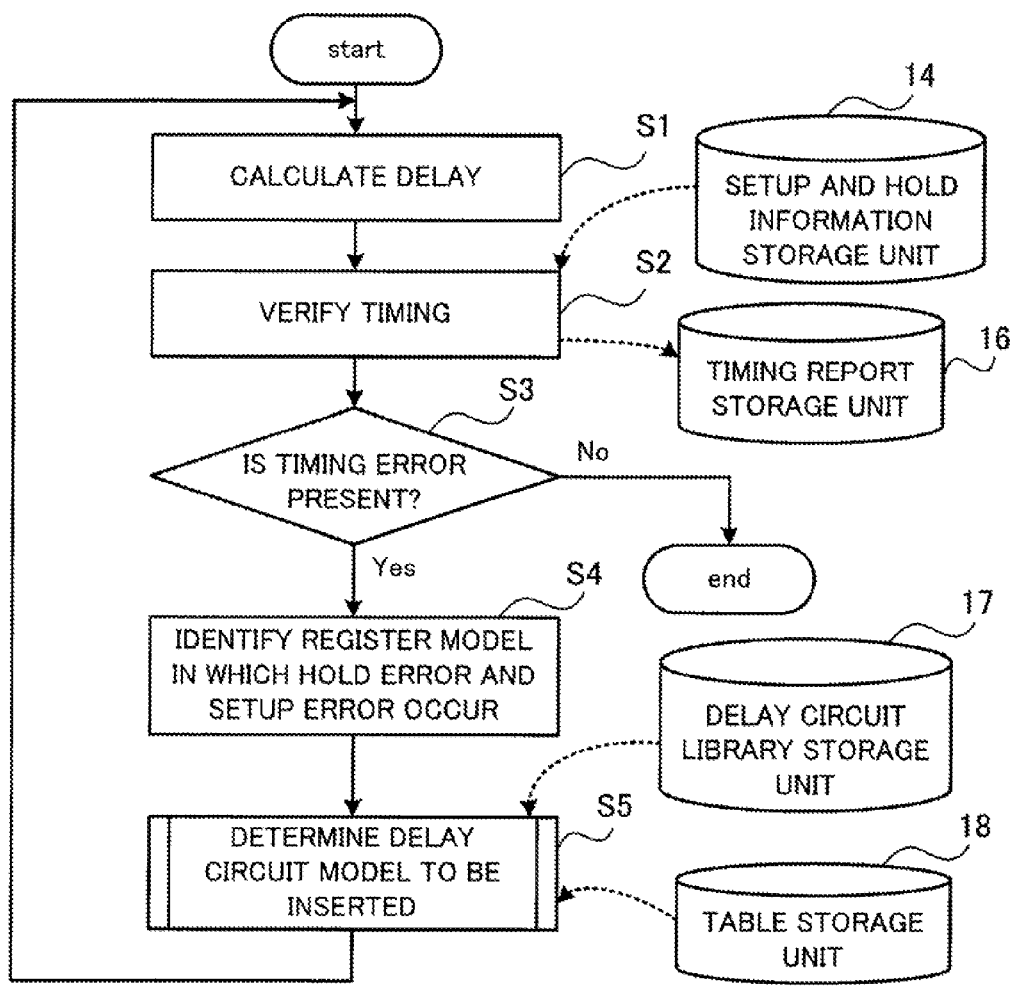
FIG. 10 is a flowchart illustrating a process of the circuit design support apparatus.

FIG. 10 is a flowchart illustrating a process of the circuit design support apparatus.

[Step S1] The circuit delay calculation unit 13 calculates a delay of the semiconductor integrated circuit model based on the net list stored in the net list storage unit 11 and the library stored in the library storage unit 12. The process then proceeds to step S2.

[Step S2] Based on the setup information and the hold information, the timing verification unit 15 performs static timing analysis of the semiconductor integrated circuit model, and determines whether the delay time calculated by the circuit delay calculation unit 13 causes a timing violation from a relative relationship between the clock signal and the data signal. The timing verification unit 15 then stores verification results in the timing report storage unit 16.

[Step S3] The delay circuit model determination unit 19 determines whether the register model in which the timing violation (a hold error or a setup error) occurs is present in reports stored in the timing report storage unit 16. If the register model in which the timing violation occurs is present (Yes in step S3), the process proceeds to step S4. If the register model in which the timing violation occurs is not present (No in step S3), the delay circuit model determination unit 19 ends the process illustrated in FIG. 10, and moves to a verification step for a test pattern.

[Step S4] The delay circuit model determination unit 19 identifies the register model in which the timing violation occurs. A data signal line connected to the data signal input terminal of the register model in which an error occurs is used as an insertion part for the delay circuit model. The process then proceeds to step S5.

[Step S5] The delay circuit model determination unit 19 refers to the delay circuit library stored in the delay circuit library storage unit 17 and the component management table T1 stored in the table storage unit 18, and determines a delay circuit model to be inserted. The process then proceeds to step S1.

With this, the description of the processes of FIG. 10 is ended.

A determination process of the delay circuit model of step S5 will be described in more detail below.

Figure 11:
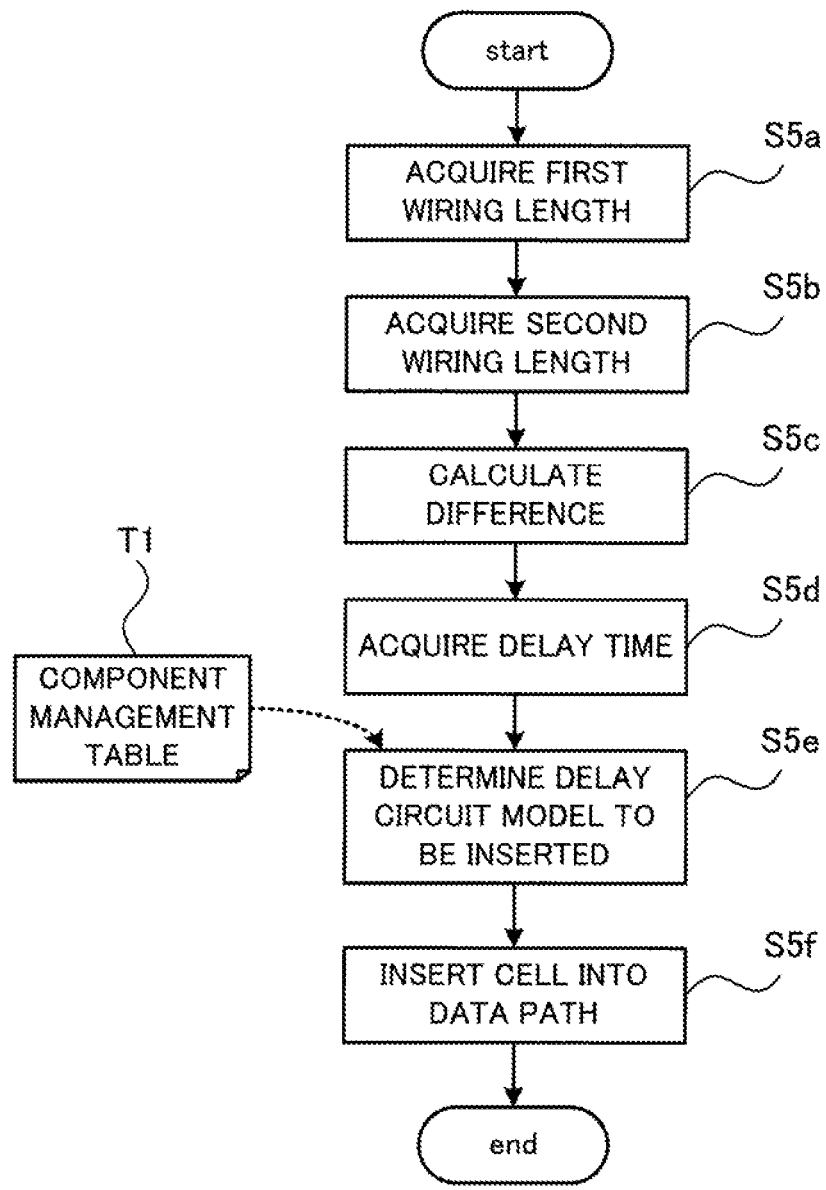
FIG. 11 is a flowchart illustrating a determination process of the delay circuit model.

FIG. 11 is a flowchart illustrating the determination process of the delay circuit model.

[Step S5a] Among the clock signal lines, the delay circuit model determination unit 19 identifies a branch point of the clock signal line which supplies the clock signal to the pre-stage register model of the register model in which an error occurs. Further, the delay circuit model determination unit 19 acquires a length (hereinafter, referred to as a "first wiring length") of the clock signal line, from the identified branch point to the clock signal input terminal of the register model which is connected thereto and in which an error occurs. The process then proceeds to step S5b.

[Step S5b] The delay circuit model determination unit 19 acquires a length of the clock signal line which supplies the clock signal to the pre-stage register model from the above-described branch point. The delay circuit model determination unit 19 acquires a length of the data wiring which connects the data signal output terminal of the pre-stage register model and the data signal input terminal of the register model in which the timing violation occurs. Further, the delay circuit model determination unit 19 acquires a sum (hereinafter, referred to as a "second wiring length") of the acquired length of the clock signal line and that of the data wiring. The process then proceeds to step S5c.

[Step S5c] The delay circuit model determination unit 19 calculates a difference between the first and second wiring lengths. The process then proceeds to step S5d.

[Step S5d] The delay circuit model determination unit 19 acquires a delay time between the data path and the clock path by the timing verification. The process then proceeds to step S5e.

[Step S5e] The delay circuit model determination unit 19 refers to the component management table T1. The delay circuit model determination unit 19 then determines a delay circuit model to be inserted.

[Step S5f] The delay circuit model determination unit 19 inserts the delay circuit model determined in step S5e into the data signal line connected to the data signal input terminal of the register model in which the timing violation occurs. The circuit design support apparatus 10 then ends the determination process of the delay circuit model, and the process proceeds to step S1.

With this, the description of FIG. 11 is ended. In FIG. 11, an example in which a delay circuit model is selected based on the wiring length is described; however, it is not limited thereto, and a delay circuit model may be selected based on the wiring resistance, the wiring capacitance, or the delay time of the wiring, or a combination thereof. In this case, a delay circuit model may be selected by using the same method as that of FIG. 11.

A specific example of the determination process of a delay circuit model to be inserted will be described below.

Figure 12:
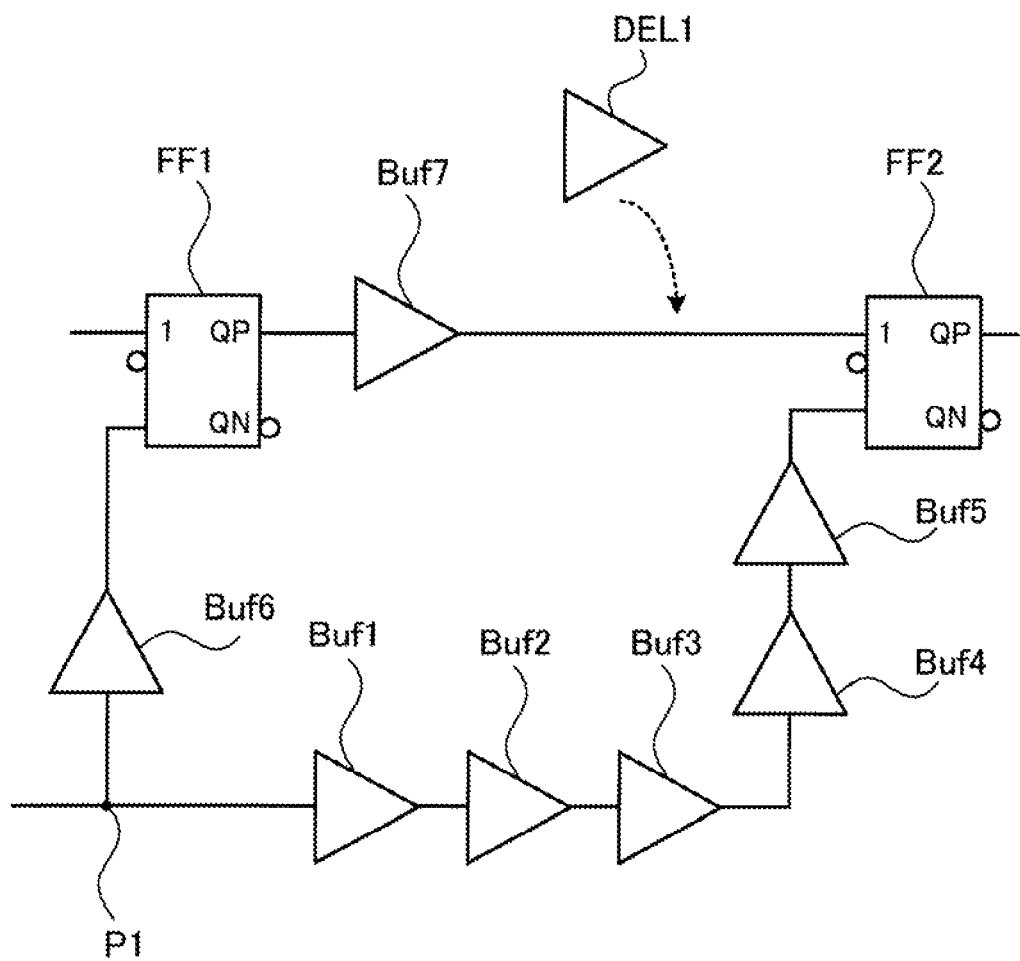
FIG. 12 illustrates a specific example of the determination process of the delay circuit model.

FIG. 12 illustrates a specific example of the determination process of a delay circuit model. In FIG. 12, a register (flip-flop) model FF2 in which the timing violation occurs and a pre-stage register model FF1 of the register model FF2 are illustrated.

The delay circuit model determination unit 19 acquires a first wiring length. The first wiring length illustrated in FIG. 12 is a length of the clock signal line connected to the clock signal input terminal of the post-stage register model FF2 from the branch point P1 via the buffer models Buf1, Buf2, Buf3, Buf4, and Buf5. Suppose that this first wiring length is 500 µm.

Next, the delay circuit model determination unit 19 acquires a second wiring length. The second wiring length illustrated in FIG. 12 is a sum of a length of the clock signal line connected to the clock signal input terminal of the pre-stage register model FF1 from the branch point P1 via the buffer model Buf6 and that of the data wiring connected to the data signal input terminal of the register model FF2 from the data signal output terminal of the register model FF1 via the buffer model Buf7. Suppose that the second wiring length is 400 µm.

Next, the delay circuit model determination unit 19 calculates a difference between the first wiring length 500 µm and the second wiring length 400 µm and acquires the difference 100 µm. Further, the delay circuit model determination unit 19 acquires the delay time 1 ns lacking in the data path through the timing verification.

Next, the delay circuit model determination unit 19 refers to the component management table T1, and determines a delay circuit model to be inserted. In the present embodiment, the delay circuit model determination unit 19 determines the delay circuit model DEL1 of the delay circuit model name B matched with the wiring length 100 µm and the delay time 1 ns. Further, the delay circuit model determination unit 19 takes out the determined delay circuit model from the delay circuit library storage unit 17, and inserts it in the data wiring between the register models FF1 and FF2, for example, between an output terminal of the buffer model Buf7 and the data signal input terminal of the register model FF2. In FIG. 12, the delay circuit model determination unit 19 inserts the determined delay circuit model DEL1 between the output terminal of the buffer model Buf7 and the data signal input terminal of the register model FF2.

In the present embodiment, a case where the timing analysis is performed and then a delay circuit model is inserted is described. However, irrespective of the above, the timing verification unit 15 may perform the timing analysis at the state where the component 31 is previously arranged on the semiconductor integrated circuit model. Further, the timing verification unit 15 may determine the components 32 to 35 to be arranged by the delay circuit model determination unit 19, according to analysis results of the timing analysis, and combine them with the component 31.

Next, there will be described a semiconductor integrated circuit manufactured according to a semiconductor integrated circuit model into which a delay circuit model is inserted by the circuit design support apparatus 10.

A semiconductor integrated circuit manufactured according to a semiconductor integrated circuit model has a delay circuit arranged on a data signal line. This delay circuit has a wire load so as to compensate for difference values in physical parameters relating to wiring (e.g., at least one of the wiring length, the wiring resistance, the wiring capacitance, and the wiring delay) between the first and second paths. The first path is a path from the reference position (e.g., position equivalent to the above-described branch point P1) of the clock signal line which supplies a clock signal to the pre-stage and post-stage registers up to the clock signal input terminal of the post-stage register. On the other hand, the second path is a path from the reference position up to the data signal input terminal of the post-stage register via the pre-stage register.

As described above, according to the circuit design support apparatus 10, the delay circuit model determination unit 19 refers to the component management table T1, and determines a delay circuit model to be inserted, considering both the fluctuation of delay time due to a process variation and the fluctuation of a delay time due to a wiring variation, and inserts the delay circuit model. The delay circuit model to be inserted compensates for a difference in the physical parameters relating to wiring between the data path and the clock path, and therefore the wiring variation of the data path matches that of the clock path. As a result, the fluctuation of the delay time due to the wiring variation in the data path matches that in the clock path, and therefore the timing violation due to the wiring variation is suppressed from occurring.

Further, the selection circuit model is selected according to the delay time of the data path and the clock path. Therefore, the design may be performed considering both of the process variation and wiring variation of transistors, and the timing violation of the semiconductor integrated circuit is suppressed from occurring.

As the integration of the semiconductor integrated circuit advances (e.g., 90 nm or smaller process), temperature characteristics of transistors and those of wiring tend to be different from each other. Therefore, in the case where the delay circuit is simply inserted in order to increase a gate delay of transistors, a margin to allow circuit operations may be narrowed depending on temperature conditions.

To cope with this problem, a delay due to metal wiring is added to the delay circuit of the semiconductor integrated circuit, so that the delay circuit is able to have the same delay time and produce different temperature characteristics.

As is seen from the above discussion, according to the circuit design support apparatus 10, adjustment of the temperature characteristics may be performed. As a result, the circuit design support apparatus 10 is able to easily perform a timing adjustment with respect to the semiconductor integrated circuit model with high accuracy.

In addition, the process to be performed by the circuit design support apparatus 10 may be distributed to and processed by using two or more devices. For example, one device may perform the process up to timing analysis processing to create a timing report, and another device may determine the delay circuit model to be arranged based on the timing report.

With this, while the circuit design support apparatus, method, and semiconductor integrated circuit of the present invention are described based on the embodiments illustrated in the drawings, the embodiments of the present invention are not limited thereto; the configurations of the components may be replaced with any other configurations having the same functions. In addition, other arbitrary components or processes may be added to the present invention.

Further, in the present invention, two or more arbitrary configurations (characteristics) may be combined among the above-described embodiments.

The above-described processing functions may be realized with a computer. In that case, programs are provided which describe contents of the processing functions to be executed by the circuit design support apparatuses 1 and 10. By causing the computer to execute the programs, the above-described processing functions are realized on the computer. The programs describing the contents of the processing functions may be recorded on a computer-readable recording medium. The computer-readable recording medium includes a magnetic recording device, an optical disc, a magneto-optical recording medium, and a semiconductor memory. The magnetic recording device includes a hard disk drive (HDD), a flexible disk (FD), and a magnetic tape. The optical disc includes a DVD, a DVD-RAM, a CD-ROM, and a CD-R/RW. The magneto-optical recording medium includes a magneto-optical disk (MO).

When the programs are circulated on markets, for example, a portable recording medium, such as a DVD or a CD-ROM, recording the programs is commercialized for sale. The programs may also be circulated by storing the programs in a memory device of a server computer, and by transferring the stored programs from the server computer to other computers via a network.

The computer for executing the programs stores the programs recorded on the portable recording medium or the programs transferred from the server computer in its own memory device, for example. The computer reads the programs from its own memory device and executes processing in accordance with the programs. Alternatively, the computer may execute processing in accordance with the programs by directly reading the programs from the portable recording medium. The computer may also execute processing in such a way that, whenever part of the programs are transferred from the server computer connected via a network, the computer sequentially executes processing in accordance with the received program.

Also, at least part of the above-described processing functions may be realized with an electronic circuit, such as a digital signal processor (DSP), an application specific integrated circuit (ASIC), or a programmable logic device (PLD).

As is seen from the embodiments described above, according to the proposed circuit design support apparatus, circuit design support method, and semiconductor integrated circuit, timing violations in semiconductor integrated circuits are suppressed from occurring.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that various changes, substitutions, and alterations could be made hereto without departing from the spirit and scope of the invention.

What is claimed is:

1. A circuit design support apparatus comprising:
a selection unit to select a delay circuit from among two or more delay circuits with different wire load values, on the basis of a difference value in a physical parameter between a first path and a second path; and
an arrangement unit to arrange the selected delay circuit on the first path or the second path, wherein: the first path is a path that leads to a clock signal input terminal of a first resister from a reference position of a clock signal line; and
the second path includes a path leading to a clock signal input terminal of a second resister from the reference position of the clock signal line, and a path leading to a data signal input terminal of the first register from a data signal output terminal of the second register.

2. The circuit design support apparatus according to claim 1, wherein the selection unit selects the delay circuit further on the basis of a delay time of a data signal supplied to the data signal input terminal with respect to a clock signal.

3. The circuit design support apparatus according to claim 1, further comprising a storage unit to store a table in which values concerning at least one of a wiring length, a wiring resistance, a wiring capacitance and wiring delay and information identifying the delay circuit are stored in association with each other,
wherein the selection unit selects the delay circuit on the basis of the table.

4. The circuit design support apparatus according to claim 1, wherein by referring to a storage unit in which two or more inverter circuits and two or more wires having the different values concerning a wiring length, a wiring resistance, a wiring capacitance or wiring delay for connecting between the inverter circuits are stored, the arrangement unit creates the delay circuit in which an inverter circuit and a wire are combined and arranged.

5. The circuit design support apparatus according to claim 4, wherein the wire extends over two or more layers.

6. The circuit design support apparatus according to claim 1, wherein the physical parameter is one of a wiring length, a wiring resistance, a wiring capacitance and wiring delay.

7. A circuit design support method comprising:

selecting, by a processor, a delay circuit from among two or more delay circuits with different wire load values, on the basis of a difference value in a physical parameter between a first path and a second path; and arranging, by the processor, the selected delay circuit on the first path or the second path, wherein:

the first path is a path that leads to a clock signal input terminal of a first resister from a reference position of a clock signal line; and the second path includes a path leading to a clock signal input terminal of a second resister from the reference position of the clock signal line, and a path leading to a data signal input terminal of the first register from a data signal output terminal of the second register.

8. The circuit design support method according to claim 7, wherein the physical parameter is one of a wiring length, a wiring resistance, a wiring capacitance and wiring delay.

9. A semiconductor integrated circuit comprising:

a first register;

a second register; and a delay circuit which has wire load that compensates for a difference value in a physical parameter between a first path and a second path, wherein:

the first path is a path that leads to a clock signal input terminal of the first resister from a reference position of a clock signal line; and the second path includes a path leading to a clock signal input terminal of the second resister from the reference position of the clock signal line, and a path leading to a data signal input terminal of the first register from a data signal output terminal of the second register.

10. The semiconductor integrated circuit according to claim 9, wherein the physical parameter is one of a wiring length, a wiring resistance, a wiring capacitance and wiring delay.

11. The semiconductor integrated circuit according to claim 9, wherein the delay circuit is inserted in a data signal line connected to the data signal input terminal.

* * * * *